United States Patent [19]

Sichanugrist et al.

[11] Patent Number: 5,336,623
[45] Date of Patent: Aug. 9, 1994

[54] PROCESS FOR PRODUCING INTEGRATED SOLAR CELL

[75] Inventors: Porponth Sichanugrist, Kanagawa; Tetsuro Nii, Tokyo, both of Japan

[73] Assignee: Showa Shell Sekiyu K.K., Tokyo, Japan

[21] Appl. No.: 25,128

[22] Filed: Mar. 2, 1993

[30] Foreign Application Priority Data

Mar. 2, 1992 [JP] Japan ................................. 4-44375

[51] Int. Cl.$^5$ ........................................ H01L 31/036
[52] U.S. Cl. ................................ 437/4; 437/24; 437/937; 136/258
[58] Field of Search ............. 437/24, 937, 233, 234, 437/4; 136/258, 249; 204/164

[56] References Cited

U.S. PATENT DOCUMENTS

| | | | |
|---|---|---|---|
| 4,151,058 | 4/1979 | Kaplan et al. | 437/937 |
| 4,609,771 | 9/1986 | Guha et al. | 136/249 |
| 4,781,765 | 11/1988 | Watanabe et al. | 136/249 |
| 4,875,944 | 10/1989 | Yoshida | 136/249 |
| 5,214,002 | 5/1993 | Hayashi et al. | 437/234 |

FOREIGN PATENT DOCUMENTS

| | | | |
|---|---|---|---|
| 0069580 | 1/1983 | European Pat. Off. | 437/24 |
| 0153043 | 8/1985 | European Pat. Off. | |
| 0189636 | 8/1986 | European Pat. Off. | |
| 63-232415 | 9/1988 | Japan | 437/24 |
| 3-175681 | 7/1991 | Japan | |

OTHER PUBLICATIONS

Patent Abstracts of Japan, vol. 15, No. 143 (E'1054) Apr. 11, 1991 (JP 3021080).
Patent Abstracts of Japan, vol. 16, No. 210 (E-1203) May 19, 1992 (JP 4035021).
Applied Physics Letters, vol. 56, No. 6, Feb. 5, 1990, New York, pp. 533–535, A. Asano, 'Effects of Hydrogen Atoms on the Network Structure of Hydrogenated Amorphous and Microcrystalline Silicon Thin Films'.
Nineteenth IEEE Photovoltaic Specialists Conference, New Orleans, La., May 4th–8th, 1987, pp. 1095–1100, IEEE, New York, T. Yoshida et al.: "High Efficiency a-Si:H Two-Stacked Tandem Solar Cell".

Primary Examiner—T. N. Quach
Attorney, Agent, or Firm—Sughrue, Mion, Zinn, Macpeak & Seas

[57] ABSTRACT

A process for producing an integrated solar cell comprising deposited unit cells having a p-i-n junction, with an n-type layer forming an n-p junction between unit cells comprising a microcrystalline amorphous silicon layer, in which said microcrystalline amorphous silicon layer is subjected to a hydrogen discharge treatment for a given period of time. By the hydrogen discharge treatment, the film resistance of the n-type layer is reduced to accelerate ohmic property with a p-type layer thereby achieving increased conversion efficiency.

3 Claims, 1 Drawing Sheet

PROCESS FOR PRODUCING INTEGRATED SOLAR CELL

FIELD OF THE INVENTION

This invention relates to a process for producing an integrated solar cell in which an n-type layer forming an n-p junction between unit cells comprises a microcrystalline amorphous silicon layer. More particularly, it relates to a process for producing an integrated amorphous silicon solar cell which is suitable for accelerating ohmic property of an n-p junction to achieve increased photovoltaic efficiency of solar cells.

BACKGROUND OF THE INVENTION

Integrated solar cells comprising amorphous silicon (hereinafter abbreviated as a-Si) having a p-i-n junction typically have the layer structure shown in FIG. 1. The integrated solar cells of this type are prepared as follows.

Transparent electrode layer 2 comprising a transparent conductive film of tin oxide ($SnO_2$), etc. is formed on glass substrate 1 to a thickness of about 0.5 to 1.0 $\mu$m by thermal CVD. On transparent electrode layer 2 are deposited a-Si layer 3 (e.g., p-type a-Si layer, hereinafter referred to as player) having a thickness of about 200 Å, intrinsic a-Si layer 4 (hereinafter referred to as i layer) having a thickness of about 0.1 $\mu$m, and n-type microcrystalline silicon layer 5 (hereinafter referred to as n($\mu$c-si) layer) having a thickness of about 200 Å in this order by plasma discharge decomposition to form a first cell. Gases to be used for p layer formation are silane ($SiH_4$), diborane ($B_2H_6$), and methane ($CH_4$), and gases to be used for n($\mu$c-Si) layer formation are $SiH_4$, hydrogen ($H_2$), and phosphine ($PH_3$).

On n($\mu$c-Si) layer 5 of the first cell are further deposited p layer 6, i layer 7 and n($\mu$c-Si) layer 8 in this order to form a second cell having a p-i-n junction. The film forming conditions for the second cell are virtually the same as for the first cell, except that the i layer of the second cell is as thick as 0.4 $\mu$m. Finally, back electrode 9 is formed out of a metal, such as aluminum or silver, to a thickness of at least 2000 Å by sputtering or vacuum evaporation. A transparent conductive film or a conductive paste may also serve as a back electrode.

In an attempt to increase conversion efficiency by integrated unit cells, it is necessary to make the n-p junction having a better ohmic contact between a first cell and a second cell. To this effect, conventional solar cells have used an n($\mu$c-Si) layer as an n-type layer of the first cell, with its thickness reduced to about 100 to 400 Å so as to minimize the loss due to light absorption by the layer itself.

In general, however, reduction of the thickness of a microcrystalline film results in failure of microcrystallization. It follows that electrical conductivity drastically decreases, making it difficult to maintain ohmic properties.

SUMMARY OF THE INVENTION

Accordingly, an object of the present invention is to provide a process for producing an integrated solar cell, in which crystallization of an n($\mu$c-Si) layer of a first cell is accelerated to enhance ohmic property with a p layer of a second cell to thereby achieve high conversion efficiency.

The above object of the present invention is accomplished by a process for producing an integrated solar cell comprising unit cells having a p-i-n junction with an n($\mu$c-Si) layer as an n-type layer forming an n-p junction between unit cells, in which said n($\mu$c-Si) layer is subjected to hydrogen discharge treatment for a given period of time.

The hydrogen discharge treatment is conducted for not more than about 10 minutes, preferably about 0.5 to 3.5 minutes, more preferably about 2 to 3.5 minutes, and most preferably about 3 minutes.

By subjecting an n($\mu$c-Si) layer to a hydrogen discharge treatment for a given period of time, the film resistance of the n-type layer can be reduced probably due to accelerated crystallization on the surface of the n-type layer. As a result, the ohmic property of the n-p junction are enhanced, making it possible to increase conversion efficiency of the integrated solar cell.

DETAILED DESCRIPTION OF THE INVENTION

The present invention is illustrated by way of Examples. In what follows, formation of a hydrogen discharge treated n($\mu$c-Si) layer, as improved n-p junction, of the present invention will be explained. The other basic structure of the integrated solar cell of the present invention accords with FIG. 1.

In Examples, integrated solar cells of the present invention were produced as follows.

A unit cell having a p-i-n junction was deposited on a glass substrate by plasma CVD method, wherein n layer was a characteristic n($\mu$c-Si) layer. The n($\mu$c-Si) layer was then subjected to hydrogen discharge treatment for a given period of time. The second unit cell having a p-i-n junction was deposited on the hydrogen discharge treated n($\mu$c-Si) layer. The effect of the hydrogen discharge treatment on conductivity of the n($\mu$c-Si) layer was examined.

Conditions for n($\mu$c-Si) layer formation and for hydrogen discharge treatment were as follows.

Figure 2:
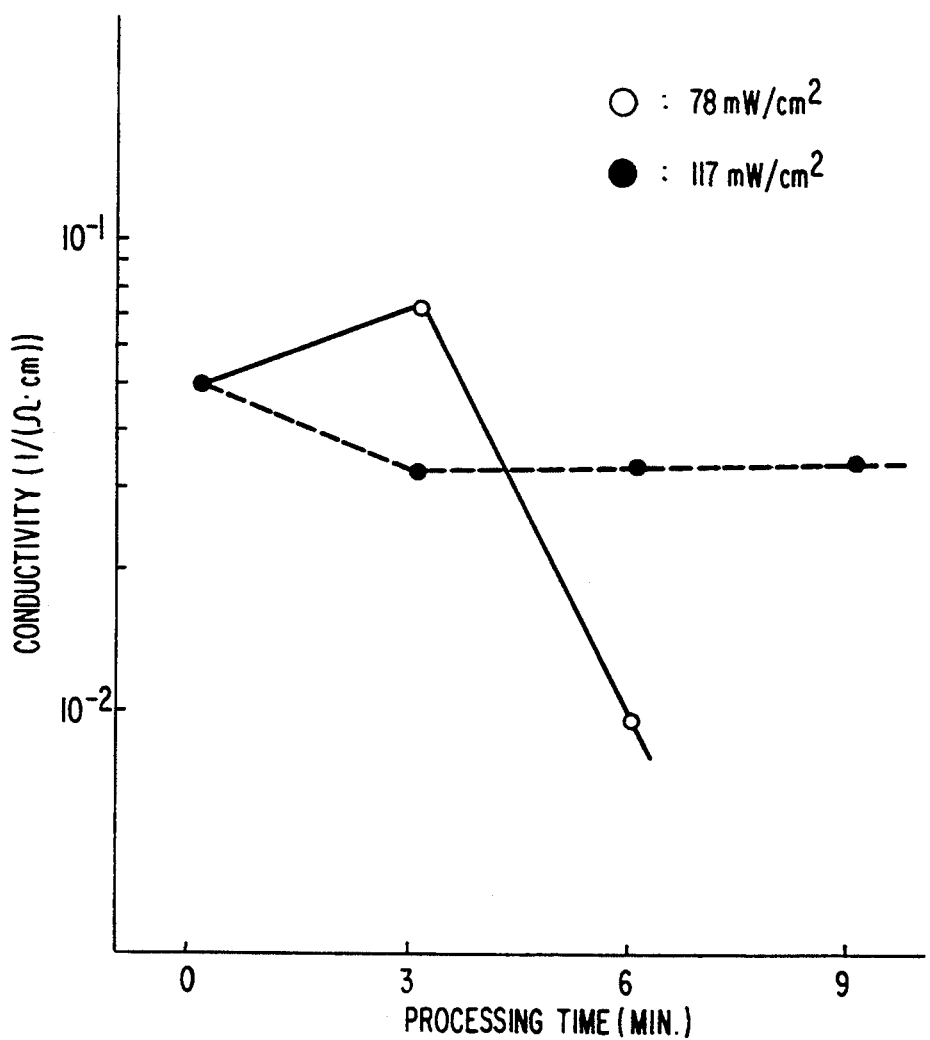
FIG. 2 is a graph showing the influences of a hydrogen discharge treatment for a varying treating time and radiofrequency power density upon conductivity of an n($\mu$c-Si) layer.

Conditions for n($\mu$c-Si) Layer Formation:
  Substrate temperature: 200° C.
  Pressure: 1.0 Torr
  Power density: about 156 mW/cm$^2$
  $SiH_4$ flow rate: 2 sccm
  $PH_3$ flow rate: 0.01 sccm
  $H_2$ flow rate: 370 sccm Conditions for Hydrogen Discharge Treatment:
  Substrate temperature: b 200° C.
  Pressure: 0.5 Torr
  Power density: varying from about 78 to 117 mW/cm$^2$
  $H_2$ flow rate: 300 sccm
  Treating time: varying from 3 to 9 minutes The results obtained are shown in FIG. 2, with the treating time as abscissa and the conductivity of the n($\mu$c-Si) layer as ordinate. The line with hollow circle (o) is for a power density of 78 mW/cm$^2$, and that with solid circle (•) is for a power density of 117 mW/cm$^2$. It was confirmed that the conductivity of the n($\mu$c-Si) layer was approximately 1.5 times when treated at a power density of 117 mW/cm² for 3 minutes, as compared to the conductivity without hydrogen discharge treatment.

The effect of the hydrogen discharge treatment was examined between the integrated solar cell produced by the film formation of the present invention and a conventional solar cell.

Figure 1:
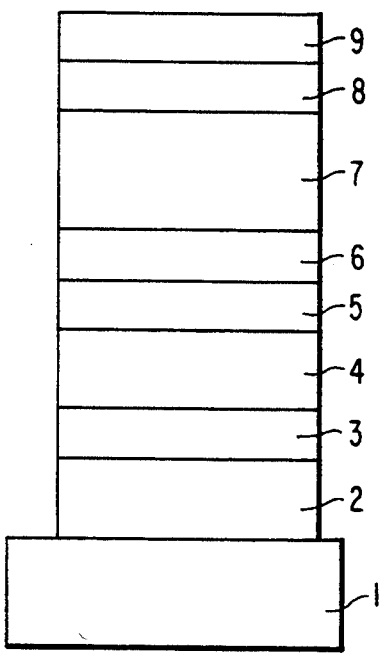
FIG. 1 is a schematic cross section of an integrated solar cell device.

According to the layer structure of FIG. 1, SnO₂ was deposited on a glass substrate to a thickness of about 4500 Å by thermal CVD to forth transparent electrode layer 2. On transparent electrode layer 2 were deposited p layer 3 (thickness: 100 Å), i layer 4 (thickness: 1000 Å), and n(μc-Si) layer 5 (thickness: about 300 Å) in this order by using a single chamber plasma CVD apparatus to form a first cell. Thereafter, hydrogen gas was made to flow to conduct a hydrogen discharge treatment under the same conditions as described above. After the hydrogen discharge treatment, p layer 6, i layer 7 and n layer 8 were further deposited thereon to form a second cell in the same manner as for the first cell except that the i layer had a thickness of about 0.4 μm. Finally, silver was deposited thereon by vacuum evaporation to a thickness of about 7000 Å to form back electrode 9.

The thus prepared solar cell device was compared with a conventional solar cell device in performance characteristics. The results are shown in Table 1 below. It is seen from the Table that the solar cell according to the present invention attained a conversion efficiency as high as 7.9% with incident light of 100 mW/cm². On account of the improved ohmic property of the n-p junction, the fill factor was increased from 0.67 to 0.74.

TABLE 1

| Solar Cell | Efficiency (%) | Short-Circuited Current (mA/cm²) | Open Circuit Voltage (V) | Fill Factor |
| --- | --- | --- | --- | --- |
| Conventional | 7.5 | 6.61 | 1.69 | 0.67 |
| Invention | 7.9 | 6.15 | 1.74 | 0.74 |

As described above, according to the present invention in which the resistance of the n(μc-Si) layer is reduced by the hydrogen discharge treatment, the ohmic property of the n-p junction between the n(μc-Si) layer of the first cell and the p layer of the second cell are accelerated, making it possible to produce an integrated solar cell of high performance.

While the invention has been described in detail and with reference to specific examples thereof, it will be apparent to one skilled in the art that various changes and modifications can be made therein without departing from the spirit and scope thereof.

What is claimed is:

1. A process for producing an integrated solar cell for accelerating the ohmic property of an n-p junction, the integrated solar cell comprising unit cells having a p-i-n junction, with an n-type layer having a reduced resistance and forming an n-p junction between unit cells comprising a michrocrystalline amorphous silicon layer, in which the process includes a step of subjecting said michrocystalline amorphous silicon layer to a hydrogen discharge treatment for a given period of time to reduce resistance.

2. A process as claimed in claim 1, wherein said hydrogen discharge treatment is conducted for not more than 10 minutes.

3. A process as claimed in claim 1, wherein said hydrogen discharge treatment is conducted for 0.5 to 3.5 minutes.

* * * * *